United States Patent
Lee et al.

(10) Patent No.: US 9,653,363 B2
(45) Date of Patent: May 16, 2017

(54) METHODS OF FABRICATING FINFET SEMICONDUCTOR DEVICES INCLUDING DUMMY STRUCTURES

(71) Applicant: Samsung Electronics Co., Ltd., Suwon-si, Gyeonggi-do (KR)

(72) Inventors: Bok-Young Lee, Seoul (KR); Jeong-Yun Lee, Yongin-si (KR); Dong-Hyun Kim, Siheung-si (KR); Myeong-Cheol Kim, Suwon-si (KR); Dong-Woo Han, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/167,050

(22) Filed: May 27, 2016

(65) Prior Publication Data

US 2016/0315018 A1    Oct. 27, 2016

Related U.S. Application Data

(63) Continuation of application No. 14/693,017, filed on Apr. 22, 2015, now Pat. No. 9,379,107.

(30) Foreign Application Priority Data

Apr. 22, 2014    (KR) ........................ 10-2014-0048087

(51) Int. Cl.

| | |
|---|---|
| *H01L 21/336* | (2006.01) |
| *H01L 21/8238* | (2006.01) |
| *H01L 27/088* | (2006.01) |
| *H01L 27/02* | (2006.01) |
| *H01L 21/306* | (2006.01) |
| *H01L 29/66* | (2006.01) |

(52) U.S. Cl.
CPC ............... *H01L 21/823821* (2013.01); *H01L 21/30604* (2013.01); *H01L 21/823828* (2013.01); *H01L 27/0207* (2013.01); *H01L 27/0886* (2013.01); *H01L 29/6656* (2013.01); *H01L 29/66795* (2013.01)

(58) Field of Classification Search
CPC ....... H01L 21/823821; H01L 29/66795; H01L 29/6656; H01L 27/0886; H01L 21/823828; H01L 21/30604
USPC .......................................... 438/289
See application file for complete search history.

(56) References Cited

U.S. PATENT DOCUMENTS

| | | |
|---|---|---|
| 8,035,170 B2 | 10/2011 | Inaba |
| 8,169,009 B2 | 5/2012 | Inaba |
| 8,264,021 B2 | 9/2012 | Lai et al. |

(Continued)

FOREIGN PATENT DOCUMENTS

| | | |
|---|---|---|
| KR | 10-0961197 B1 | 6/2010 |
| KR | 10-2012-0051919 A | 5/2012 |

*Primary Examiner* — Luan C Thai
(74) *Attorney, Agent, or Firm* — Myers Bigel, P.A.

(57) ABSTRACT

Provided are a semiconductor device and a method of fabricating a semiconductor device. The semiconductor device includes a first active fin and a second active fin which protrude from a substrate and extend along a first direction, a first gate structure which is on the first active fin to extend along a second direction intersecting the first direction, a second gate structure which is located adjacent to the first gate structure in the second direction and is on the second active fin to extend along the second direction, and a dummy structure which is in a space between the first gate structure and the second gate structure.

10 Claims, 17 Drawing Sheets

(56) References Cited

U.S. PATENT DOCUMENTS

| | | |
|---|---|---|
| 8,338,889 B2 | 12/2012 | Kaneko et al. |
| 8,835,936 B2 * | 9/2014 | Hoentschel ............. H01L 21/84 |
| | | 257/77 |
| 9,064,725 B2 | 6/2015 | Chen |
| 9,153,696 B2 * | 10/2015 | An ...................... H01L 29/7856 |
| 2011/0068407 A1 | 3/2011 | Yeh et al. |
| 2012/0276695 A1 | 11/2012 | Cheng et al. |
| 2013/0052801 A1 | 2/2013 | Berliner et al. |
| 2013/0075818 A1 | 3/2013 | Lee et al. |
| 2013/0099282 A1 | 4/2013 | Chen et al. |
| 2013/0105914 A1 | 5/2013 | Lin |
| 2015/0221654 A1 * | 8/2015 | Kim ....................... H01L 27/11 |
| | | 257/77 |

* cited by examiner

1200

1300

1400

METHODS OF FABRICATING FINFET SEMICONDUCTOR DEVICES INCLUDING DUMMY STRUCTURES

CROSS-REFERENCE TO RELATED APPLICATIONS

This application is a continuation of U.S. patent application Ser. No. 14/693,017, filed Apr. 22, 2015, which itself claims priority from Korean Patent Application No. 10-2014-0048087 filed on Apr. 22, 2014 in the Korean Intellectual Property Office, the disclosures of which are incorporated herein by reference in their entireties.

BACKGROUND

1. Field of the Inventive Concepts

The present inventive concepts relate to semiconductor devices and methods of fabricating the same.

2. Description of the Related Art

A nodule defect in a semiconductor device having a fin-type field effect transistor (FinFET) structure can degrade the performance of the semiconductor device. In particular, a spacer layer made of a low-k material (e.g., SiOCN) may be less resistant to etching than a spacer layer made of a material (e.g., SiN) having a higher dielectric constant. Therefore, the spacer layer made of the low-k material can be easily lost during an etching process performed to fabricate a semiconductor device. The loss of the spacer layer covering a gate structure which includes a polysilicon layer may expose the polysilicon layer to a growth gas, thus causing nodule defects.

SUMMARY

Aspects of the present inventive concepts can provide semiconductor devices structured to reduce or prevent nodule defects and thus allow enhanced product reliability.

Aspects of the present inventive concepts can also provide methods of fabricating semiconductor devices to reduce or prevent nodule defects and thus allow enhanced product reliability.

However, aspects of the present inventive concepts are not restricted to the ones set forth herein. The above and other aspects of the present inventive concepts will become more apparent to one of ordinary skill in the art to which the present inventive concepts pertain by referencing the detailed description of the present inventive concepts given below.

According to an aspect of the present inventive concepts, there is provided a semiconductor device including a first active fin and a second active fin which protrude from a substrate and extend along a first direction, a first gate structure which is on the first active fin to extend along a second direction intersecting the first direction, a second gate structure which is located adjacent to the first gate structure in the second direction and is on the second active fin to extend along the second direction, and a dummy structure which is in a space between the first gate structure and the second gate structure.

According to another aspect of the present inventive concepts, there is provided a semiconductor device including a first fin-type field effect transistor (FinFET) area which comprises a first active fin extending along a first direction and a first gate structure on the first active fin to extend along a second direction intersecting the first direction, a second FinFET area which is adjacent to the first FinFET area in the second direction and comprises a second active fin extending along the first direction and a second gate structure on the second active fin to extend along the second direction, and a dummy structure area which overlaps a region of the first FinFET area and a region of the second FinFET area.

According to still another aspect of the present inventive concepts, there is provided a method of fabricating a semiconductor device including forming a first active fin and a second active fin on a substrate to extend along a first direction, forming a first gate structure on the first active fin to extend along a second direction intersecting the first direction and a second gate structure on the second active fin to extend along the second direction, and forming a block layer on the second gate structure, wherein the block layer formed on the second gate structure is extended to partially cover the first gate structure.

According to yet another aspect of the present inventive concepts, there is provided a semiconductor device that includes a first active fin and a second active fin which protrude from a substrate and extend along a first direction, a first gate structure on the first active fin to extend along a second direction intersecting the first direction, a second gate structure on the second active fin to extend along the second direction and located adjacent to the first gate structure in the second direction, and a third gate structure not extending on an active fin and extending along the second direction between the first and second gate structures. In some embodiments, the third gate structure is spaced apart from the first gate structure and the second gate structure. In some embodiments, the third gate structure includes a first extension of the first gate structure that extends towards the second gate structure along the second direction and a second extension of the second gate structure that extends towards the first gate structure along the second direction. The first and second extensions are spaced apart from one another along the second direction by less than 30 nm. In some embodiments, the first, second and third gate structures each comprises a first layer, a second layer on the first layer and a third layer on the second layer remote from the first layer and on sidewalls of the first and second layers. Moreover, in some embodiments, the first layer comprises polysilicon, the second layer comprises a hard mask and the third layer comprises an insulating material.

BRIEF DESCRIPTION OF THE DRAWINGS

The above and other aspects and features of the present inventive concepts will become more apparent by describing in detail exemplary embodiments thereof with reference to the attached drawings, in which.

DETAILED DESCRIPTION OF THE EMBODIMENTS

Figure 1:
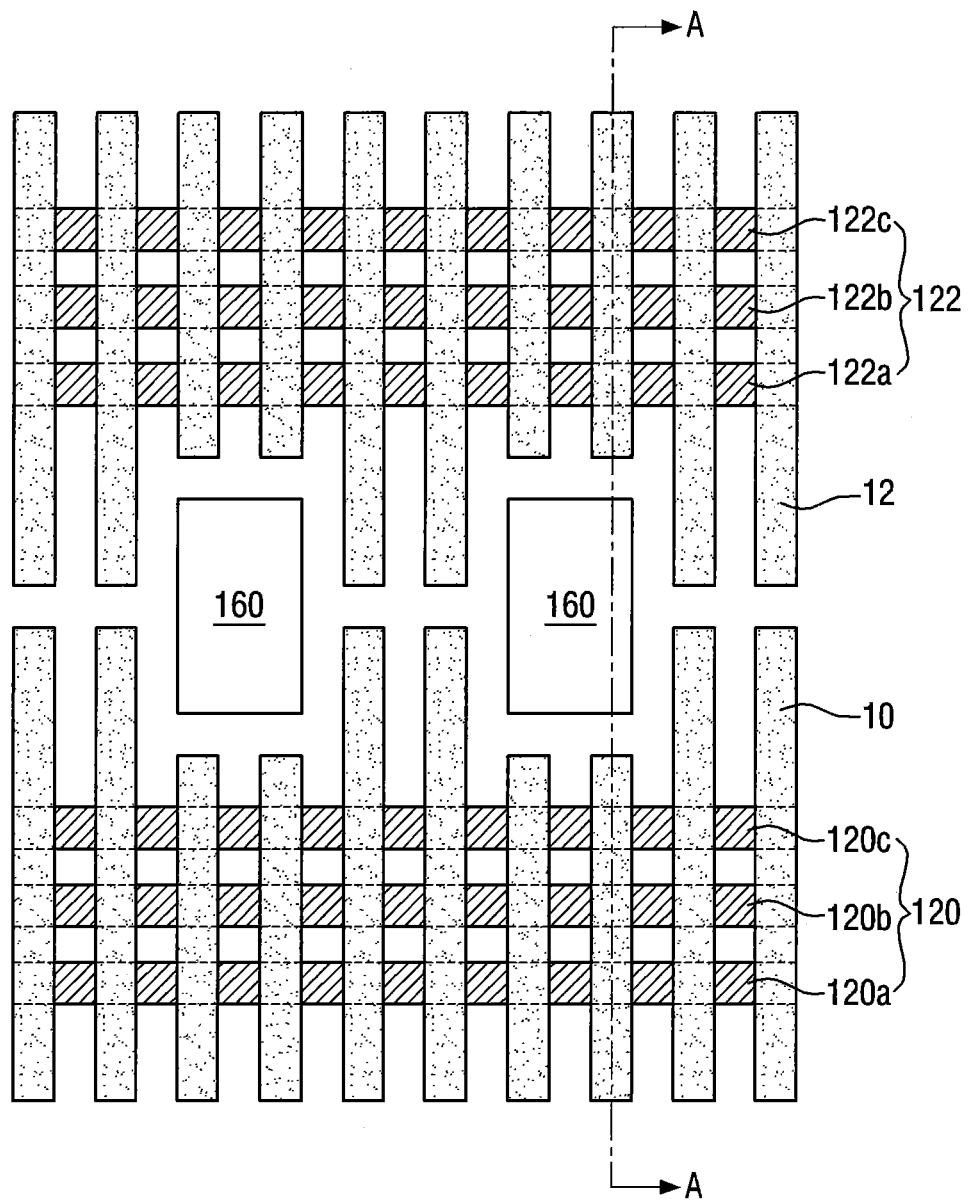
FIG. 1 is a top view of a semiconductor device according to an embodiment of the present inventive concepts.

The present inventive concepts will now be described more fully hereinafter with reference to the accompanying drawings, in which preferred embodiments of the inventive concepts are shown. The inventive concepts may, however, be embodied in different forms and should not be construed as limited to the embodiments set forth herein. Rather, these embodiments are provided so that this disclosure will be thorough and complete, and will filly convey the scope of the inventive concepts to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the inventive concepts (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. As used herein, the term "and/or" includes any and all combinations of one or more of the associated listed items and may be abbreviated as "/".

Unless defined otherwise, all technical and scientific terms used herein have the same meaning as commonly understood by one of ordinary skill in the art to which the inventive concepts belong. It is noted that the use of any and all examples, or terms provided herein is intended merely to better illuminate the inventive concepts and is not a limitation on the scope of the inventive concepts unless otherwise specified. Further, unless defined otherwise, all terms defined in generally used dictionaries may not be overly interpreted.

The present inventive concepts will be described with reference to perspective views, cross-sectional views, and/or plan views, in which various embodiments of the inventive concepts are shown. Thus, the profile of a view may be modified according to manufacturing techniques and/or allowances. That is, the embodiments of the inventive concepts are not intended to limit the scope of the present inventive concepts, but cover all changes and modifications that can be caused due to a change in manufacturing process. Thus, regions shown in the drawings are illustrated in schematic form and the shapes of the regions are presented simply by way of illustration and not as a limitation.

Figure 2:
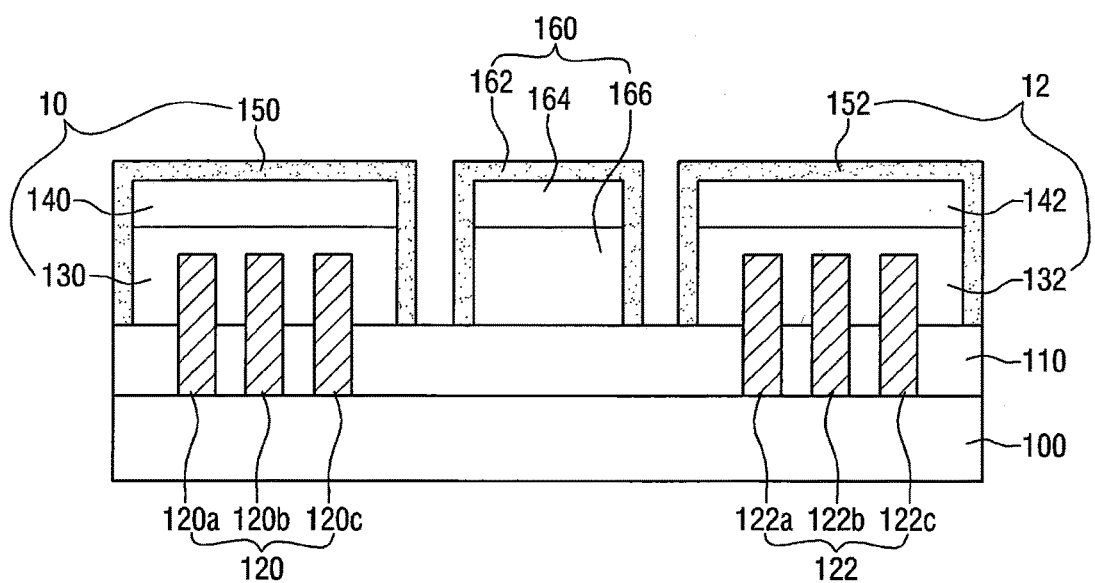
FIG. 2 is a cross-sectional view taken along the line A-A of FIG. 1.

FIG. 1 is a top view of a semiconductor device according to an embodiment of the present inventive concepts. FIG. 2 is a cross-sectional view taken along the line A-A of FIG. 1.

Referring to FIGS. 1 and 2, the semiconductor device according to the current embodiment includes a first active fin group 120 and a second active fin group 122 formed on a substrate 100. Specifically, the first active fin group 120 and the second active fin group 122 may be formed on the substrate 100 to extend along a first direction (e.g., a horizontal direction in FIG. 1). In some embodiments of the present inventive concepts, the first active fin group 120 may include a plurality of first active fins 120a through 120c, and the second active fin group 122 may include a plurality of second active fins 122a through 122c. Larger or smaller numbers of active fins may also be provided.

Specifically, the substrate 100 may be, for example, a bulk silicon substrate or a silicon-on-insulator (SOI) substrate. Otherwise, the substrate 100 may be a silicon substrate or may be a substrate formed of another material such as silicon germanium, indium antimonide, lead telluride, indium arsenide, indium phosphide, gallium arsenide, or gallium antimonide. In a method of fabricating a semiconductor device according to an embodiment of the present inventive concepts, a case where the substrate 100 is a silicon substrate will be described.

The first active fin group 120 and the second active fin group 122 may be formed by forming an etch mask on a top surface of the substrate 100 and then partially etching the substrate 100. Here, recesses may be formed around the first active fin group 120 and the second active fin group 122 formed by partially removing the substrate 100. In some embodiments of the present inventive concepts, an insulating layer 110 may be formed to fill the recesses. In FIG. 2, each of the first and second active fin groups 120 and 122 has a vertical slope. However, the present inventive concepts are not limited thereto. That is, side surfaces of each of the first and second active fin groups 120 and 122 may have an oblique slope and may be tapered.

In some embodiments of the present inventive concepts, a doping process for adjusting a threshold voltage may be performed on the first active fin group 120 and the second active fin group 122. For example, if a transistor formed using the first active fin group 120 or the second active fin group 122 is an n-type metal oxide semiconductor (NMOS) transistor, impurities used may be, for example, boron (B). If the transistor formed using the first active fin group 120 or the second active fin group 122 is a p-type metal oxide semiconductor (PMOS) transistor, the impurities used may be, for example, phosphorous (P) or arsenic (As).

Next, a plurality of first gate structures 10 are formed on the first active fin group 120. Specifically, the first gate structures 10 may be formed on the first active fin group 120 to extend along a second direction (e.g., a vertical direction in FIG. 1) intersecting the first direction. In addition, a plurality of second gate structures 12 are formed on the second active fin group 122. Specifically, the second gate structures 12 may be formed on the second active fin group 122 to extend along the second direction and may be located adjacent to the first gate structures 10 in the second direction. The first and second gate structures 10 and 12 may be formed simultaneously.

Each of the first gate structures 10 may include a polysilicon layer 130, a hard mask 140, and a spacer layer 150. That is, each of the first gate structures 10 may be a stack of the polysilicon layer 130, the hard mask 140 and the spacer layer 150. Likewise, each of the second gate structures 12 may include a polysilicon layer 132, a hard mask 142, and a spacer layer 152. That is, each of the second gate structures 12 may be a stack of the polysilicon layer 132, the hard mask 142, and the spacer layer 152. The first and second gate structures 10 and 12 may be formed using the hard masks 140 and 142 as etch masks. The hard masks 140 and 142 may include, but not limited to, silicon nitride (SiN).

The spacer layers 150 and 152 may include a low-k material such as, but not limited to, SiOCN. The spacer layers 150 and 152 may be formed by chemical vapor deposition (CVD), atomic layer deposition (ALD), etc. In some embodiments of the present inventive concepts, the hard masks 140 and 142 may be SiN, and the spacer layers 150 and 152 may be SiOCN. In an etching process performed to simultaneously etch the hard masks 140 and 142 and the spacer layers 150 and 152, the hard masks 140 and 142 may be a more etch-resistant material than the spacer layers 150 and 152.

A dummy structure 160 is formed in spaces between the first gate structures 10 and the second gate structures 12. The dummy structure 160 may be formed simultaneously with the first gate structures 10 and the second gate structures 12. The dummy structure 160 may also include a polysilicon layer 166, a hard mask 164, and a spacer layer 162. The dummy structure 160 may also be regarded as a third gate structure not extending on an active fin 120 or 122, and extending along the second direction between the first and second gate structures 10 and 12. The third gate structure is spaced apart from the first gate structure 10 and the second gate structure 12.

In some embodiments of the present inventive concepts, the dummy structure 160 may be formed in the spaces between the first gate structures 10 and the second gate structures 12 separated by a first distance.

In some embodiments of the present inventive concepts, the first distance between the first gate structures 10 and the second gate structures 12 may be, but is not limited to, 30 nm or more.

In some embodiments of the present inventive concepts, a width of the dummy structure 160 in the first direction may be greater than or equal to a width of each of the first gate structures 10 and may also be greater than or equal to a width of each of the second gate structures 12 in the first direction. That is, the width of the dummy structure 160 in the first direction may include a cross-section of one gate structure in the first direction or cross-sections of a plurality of gate structures in the first direction. For example, the width of the dummy structure 160 illustrated in FIG. 1 includes cross-sections of two gate structures in the first direction. In some embodiments of the present inventive concepts, a height of the dummy structure 160 may be greater than or equal to a height of each of the first gate structures 10 and may also be greater than or equal to a height of each of the second gate structures 12. That is, a top surface of the dummy structure 160 may be greater than or equal to a height of the spacer layer 150 of each of the first gate structures 10 and a height of the spacer layer 152 of each of the second gate structures 12.

Figure 3:
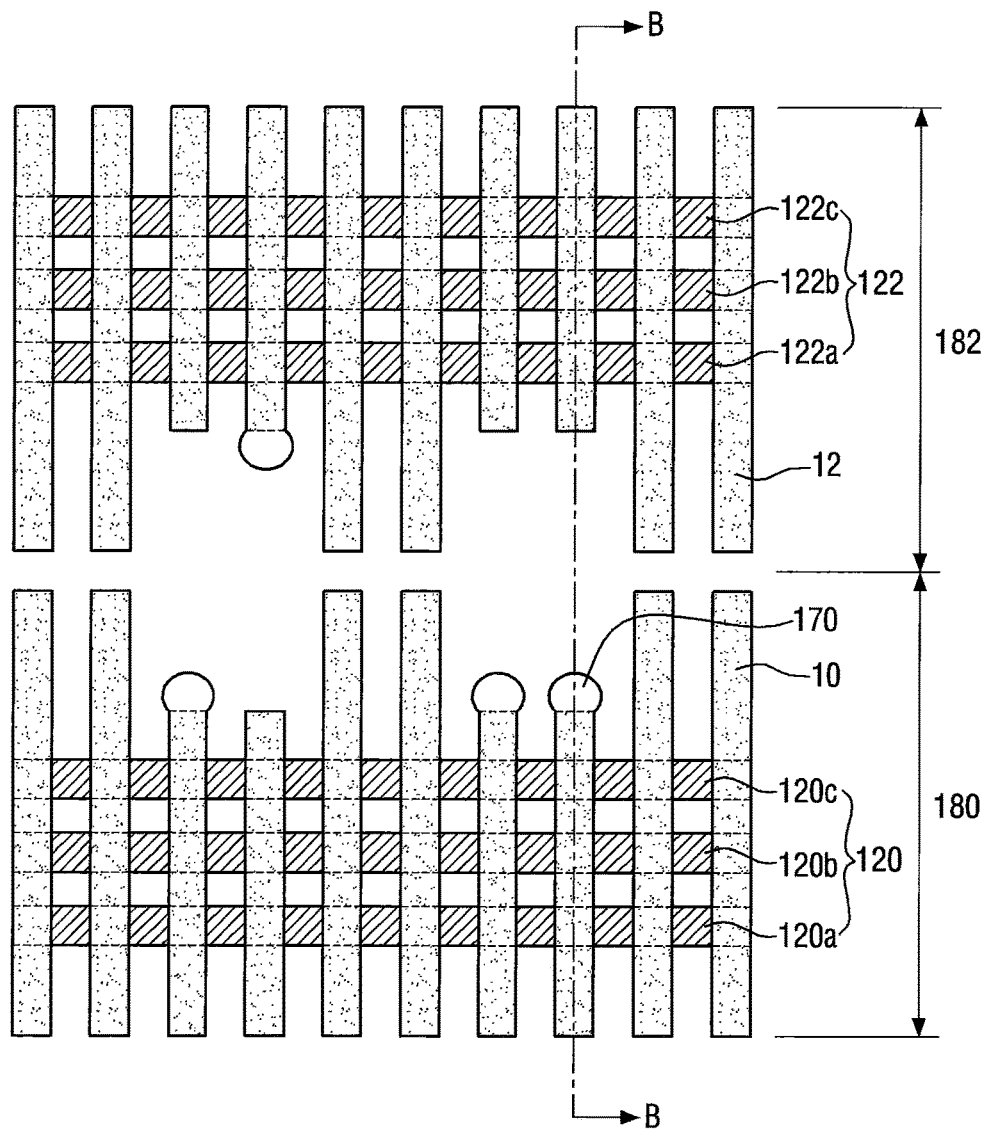
FIG. 3 is a top surface of a semiconductor device having nodule defects.
Figure 4:
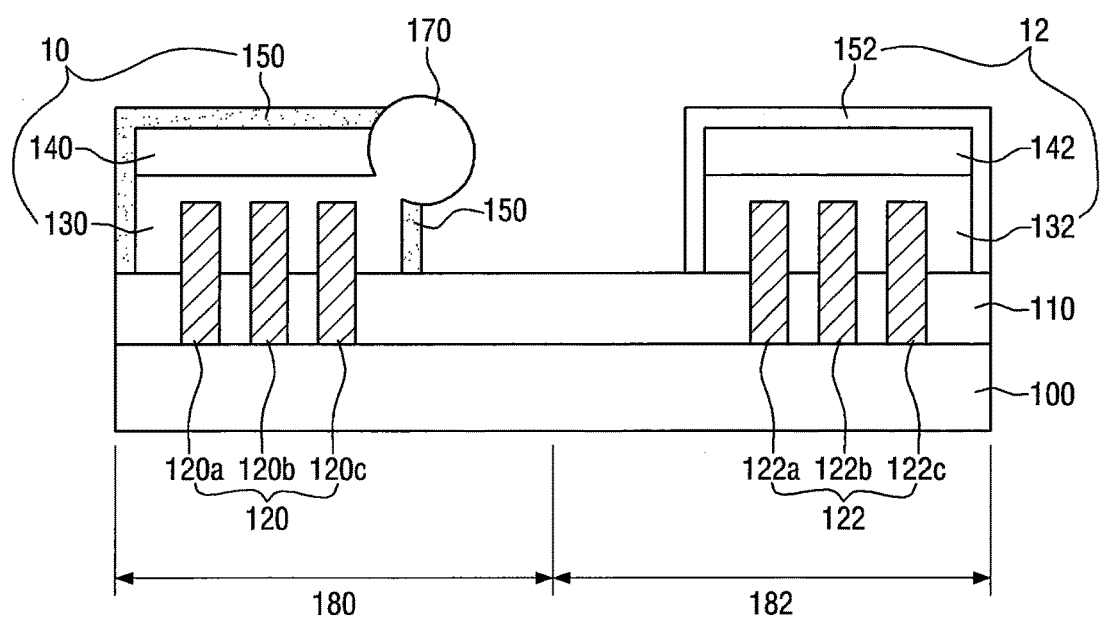
FIG. 4 is a cross-sectional view taken along the line B-B of FIG. 3.

FIG. 3 is a top surface of a semiconductor device having nodule defects. FIG. 4 is a cross-sectional view taken along the line B-B of FIG. 3.

It can be seen from FIGS. 3 and 4 that some first gate structures 10 have nodule defects 170. Specifically, if a spacer layer 150 of a first gate structure 10 is partially lost, a hard mask 140 and a polysilicon layer 130 inside the spacer layer 150 may be exposed, or the spacer layer 150 may have a thickness equal to or smaller than a threshold value. Therefore, in an area where the polysilicon layer 130 is exposed or the spacer layer 150 has a thickness equal to or smaller than the threshold value, a nodule defect 170 may be created. The nodule defect 170 is grown by the reaction of the polysilicon layer 130 with a growth gas used in a growth process. Without wishing to be bound by any theory of operation, the cause of the nodule defect 170 appears to be a distance between gate structures, that is, a width of a space between the gate structures.

Therefore, according to various embodiments of the present inventive concepts, an empty space between gate structures, that is, an empty space between first gate structures 10 and second gate structures 12 is filled with a dummy gate so as to reduce or remove the space between the first gate structures 10 and the second gate structures 12. This can reduce or suppress a three-dimensional (3D) effect in an etching process performed to fabricate a semiconductor device, thereby preventing nodule defects. In some embodiments of the present inventive concepts, a dummy gate 160 may be formed between the first gate structures 10 and the second gate structures 12 in a layout process performed to fabricate a semiconductor device.

A semiconductor device according to embodiments of the present inventive concepts may include a first fin-type field effect transistor (FinFET) area 180 and a second FinFET area 182. The first FinFET area 180 includes a first active fin group 120 extending along a first direction and first gate structures 10 on the first active fin group 120 to extend along a second direction intersecting the first direction. The second FinFET area 182 is adjacent to the first FinFET area 180 in the second direction and includes a second active fin group 122 extending along the first direction and second gate structures 12 on the second active fin group 122 to extend along the second direction. In addition, the semiconductor device according to the embodiments of the present inventive concepts may include dummy structure areas 190, each overlapping a region of the first FinFET area 180 and a region of the second FinFET area 182.

In some embodiments of the present inventive concepts, the region of the first FinFET area 180 may include a region in which the first gate structures 10 are not formed, and the region of the second FinFET area 182 may include a region in which the second gate structures 12 are not formed. In some embodiments of the present inventive concepts, the region of the first FinFET area 180 and the region of the second FinFET area 182 may be located adjacent to each other.

Figure 5:
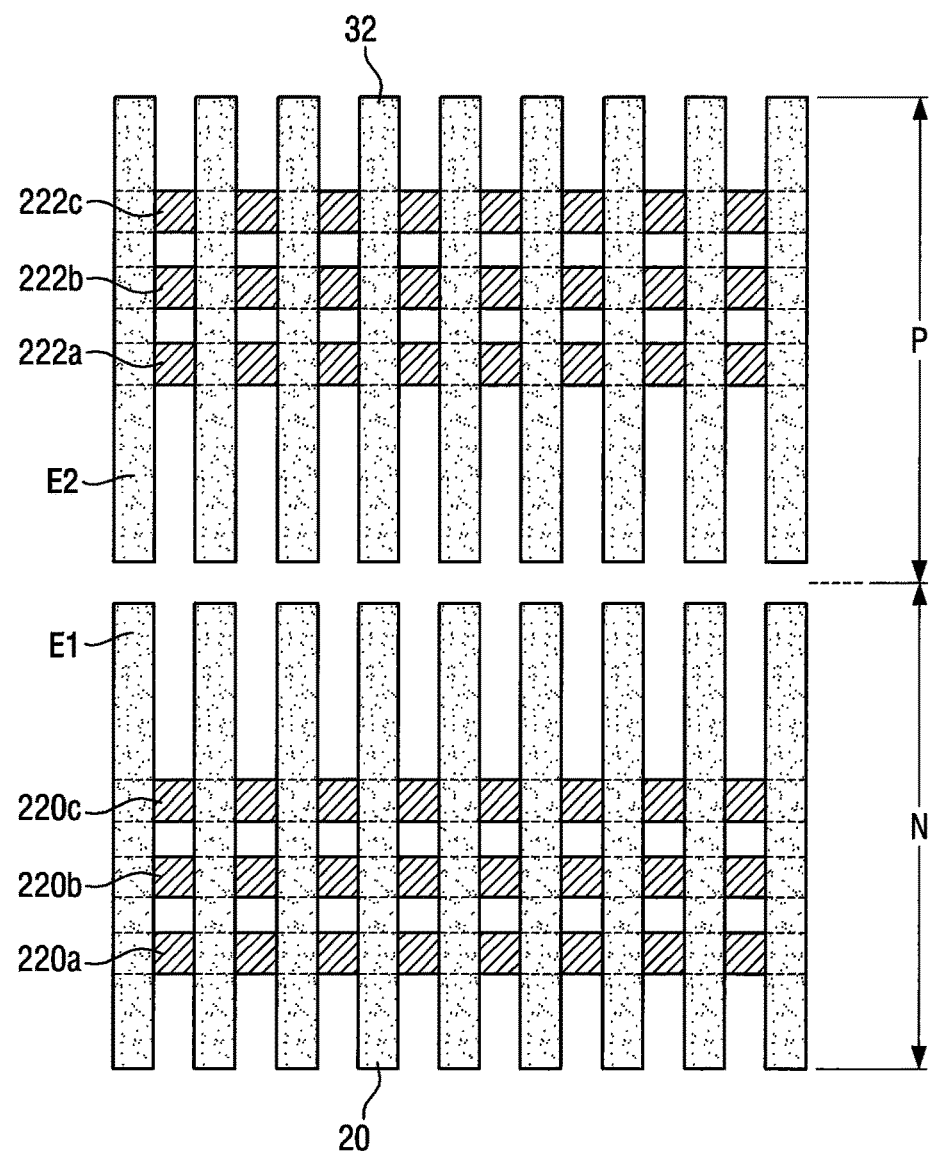
FIG. 5 is a top surface of a semiconductor device according to another embodiment of the present inventive concepts.
Figure 6:
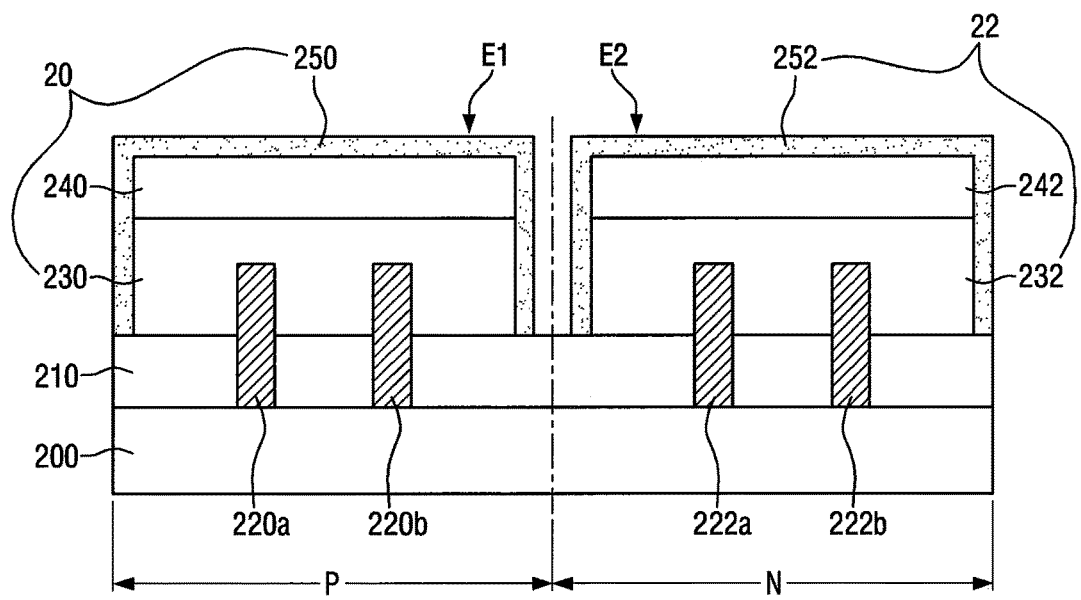
FIGS. 6 through 8 are views illustrating steps of a method of fabricating a semiconductor device according to another embodiment of the present inventive concepts.
Figure 7:
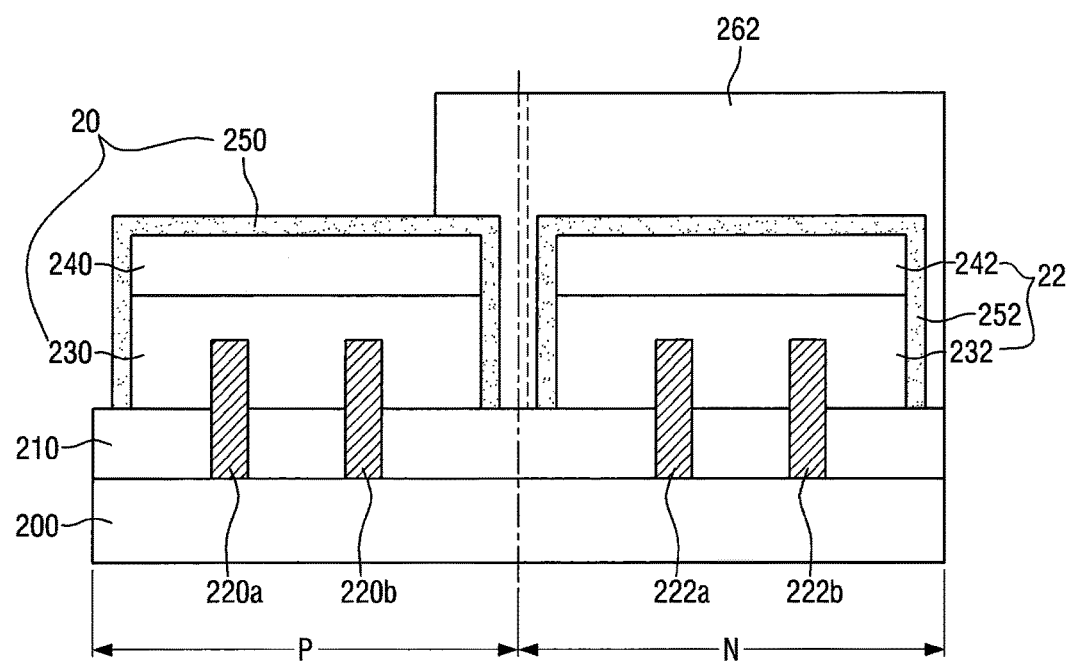
Figure 8:
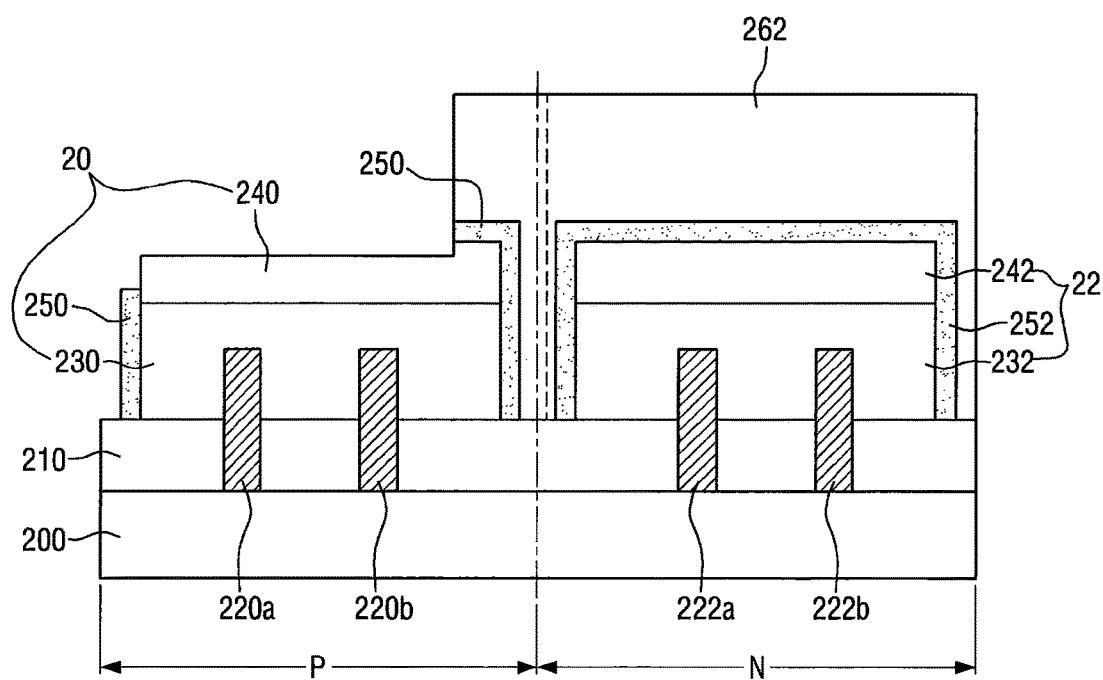

FIG. 5 is a top surface of a semiconductor device according to another embodiment of the present inventive concepts. FIGS. 6 through 8 are views illustrating steps of a method of fabricating a semiconductor device according to another embodiment of the present inventive concepts.

Referring to FIGS. 5 and 6, first active fins 220a through 220c and second active fins 222a through 222c are formed on a substrate 200 of the semiconductor device according to the current embodiment. Fewer or more fins than illustrated may be formed. Specifically, the first active fins 220a through 220c and the second active fins 222a through 222c may be formed on the substrate 200 to extend along a first direction (e.g., a horizontal direction in FIG. 5). A doping process for adjusting a threshold voltage may be performed on the first active fins 220a through 220c and the second active fins 222a through 222c. In FIG. 5, a doping process may be performed on the first active fins 220a through 220c such that a transistor formed using the first active fins 220a through 220c is a PMOS transistor, and a doping process may be performed on the second active fins 222a through 222c such that a transistor formed using the second active fins 222a through 222c is an NMOS transistor.

A plurality of first gate structures 20 are formed on the first active fins 220a through 220c. Specifically, the first gate structures 20 may be formed on the first active fins 220a through 220c to extend along a second direction (e.g., a vertical direction in FIG. 5) intersecting the first direction. In addition, a plurality of second gate structures 22 are formed on the second active fins 222a through 222c. Specifically, the second gate structures 22 may be formed on the second active fins 222a through 222c to extend along the second direction and may be located adjacent to the first gate structures 20 in the second direction. The first and second gate structures 20 and 22 may be formed simultaneously.

Accordingly, in embodiments of FIG. 5, the third gate structure not extending on an active fin and extending along the second direction between the first and second gate structures may comprise a first extension E1 of the first gate structure 20 that extends towards the second gate structure 22 along the second direction and a second extension E2 of the second gate structure 22 that extends towards the first gate structure 20 along the second direction. The first and second extensions are spaced apart from one another along the second direction by less than 30 nm, and may be formed simultaneously with the first and second gate structures 20 and 22.

A method of fabricating a semiconductor device according to another embodiment of the present inventive concepts will now be described with reference to FIGS. 6 through 8.

Referring to FIG. 6, the method of fabricating a semiconductor device according to the current embodiment includes forming first active fins 220a and 220b and second active fins 222a and 222b on a substrate 200 to extend along a first direction. In some embodiments of the present inventive concepts, the first active fins 220a and 220b and the second active fins 222a and 222b may be formed by forming an etch mask on a top surface of the substrate 200 and partially etching the substrate 200. Here, recesses may be formed around the first active fins 220a and 220b and the second active fins 222a and 222b formed by partially removing the substrate 200. In some embodiments of the present inventive concepts, the fabrication method may further include forming an insulating layer 210 to fill the recesses formed around the first active fins 220a and 220b and the second active fins 222a and 222b.

The fabrication method includes forming a first gate structure 20 on the first active fins 220a and 220b to extend along a second direction intersecting the first direction and forming a second gate structure 22 on the second active fins 222a and 222b to extend along the second direction. In some embodiments of the present inventive concepts, the first gate structure 20 may be a stack of a polysilicon layer 230, a hard mask 240, and a spacer layer 250. The second gate structure 22 may be a stack of a polysilicon layer 232, a hard mask 242, and a spacer layer 252. The first gate structure may include a first extension E1 and the second gate structure 22 may include a second gate extension E2, as was already described.

Referring to FIG. 7, the fabrication method includes forming a block layer 262 on the second gate structure 22. The block layer 262 formed on the second gate structure 22 is extended to partially cover the first gate structure 20. In other words, the forming of the block layer 262 on the second gate structure 22 may include forming the block layer 262 such that an end of the block layer 262 is located on the first gate structure 20. The first gate structure 20 may include the polysilicon layer 230, the hard mask 240, and the spacer layer 250. The spacer layer 250 may include a sidewall spacer layer formed on a side surface of the polysilicon layer 230. Here, the forming of the block layer 262 on the second gate structure 22 may include forming the block layer 262 such that an end of the block layer 262 is located between the sidewall spacer layer and the first active fin 220b. In some embodiments of the present inventive concepts, the block layer 262 may include at least one of silicon oxide, silicon nitride, silicon oxynitride, a metal layer, photoresist, spin-on-glass (SOG), and/or spin-on-hard mask (SOH).

Referring to FIG. 8, the fabrication method may further include etching a portion of the first gate structure 20 which is not covered by the block layer 262. The block layer 262 partially covering the first gate structure 20 can prevent ions scattered during the etching process from colliding with the first gate structure 20 and thus damaging the spacer layer 250.

An area (i.e., a PMOS area) in which the first gate structure 20 is formed includes a first PMOS gate structure and a second PMOS structure located adjacent to each other in the second direction. The fabrication method may further include forming a dummy structure in a space between the first PMOS gate structure and the second PMOS gate structure if a distance between the first PMOS gate structure and the second PMOS gate structure is equal to or greater than a preset threshold value. In some embodiments of the present inventive concepts, the forming of the dummy structure in the space between the first PMOS gate structure and the second PMOS gate structure may include forming the dummy structure if the distance between the first PMOS gate structure and the second PMOS gate structure is 30 nm or more.

Figure 9:
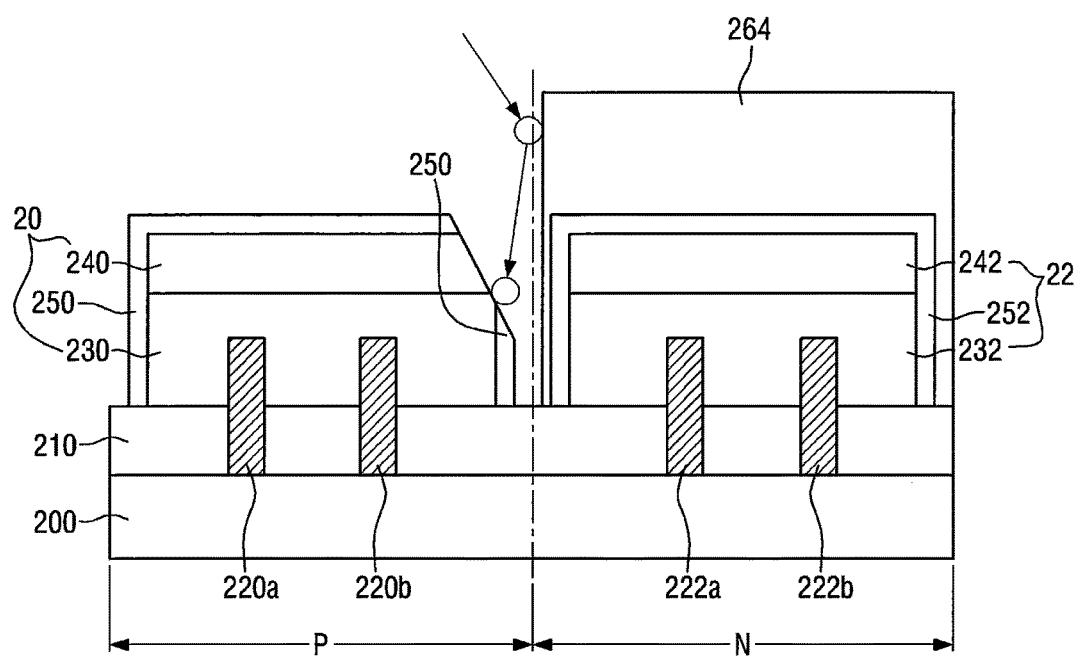
FIG. 9 is a cross-sectional view of a semiconductor device having nodule defects.
Figure 10:
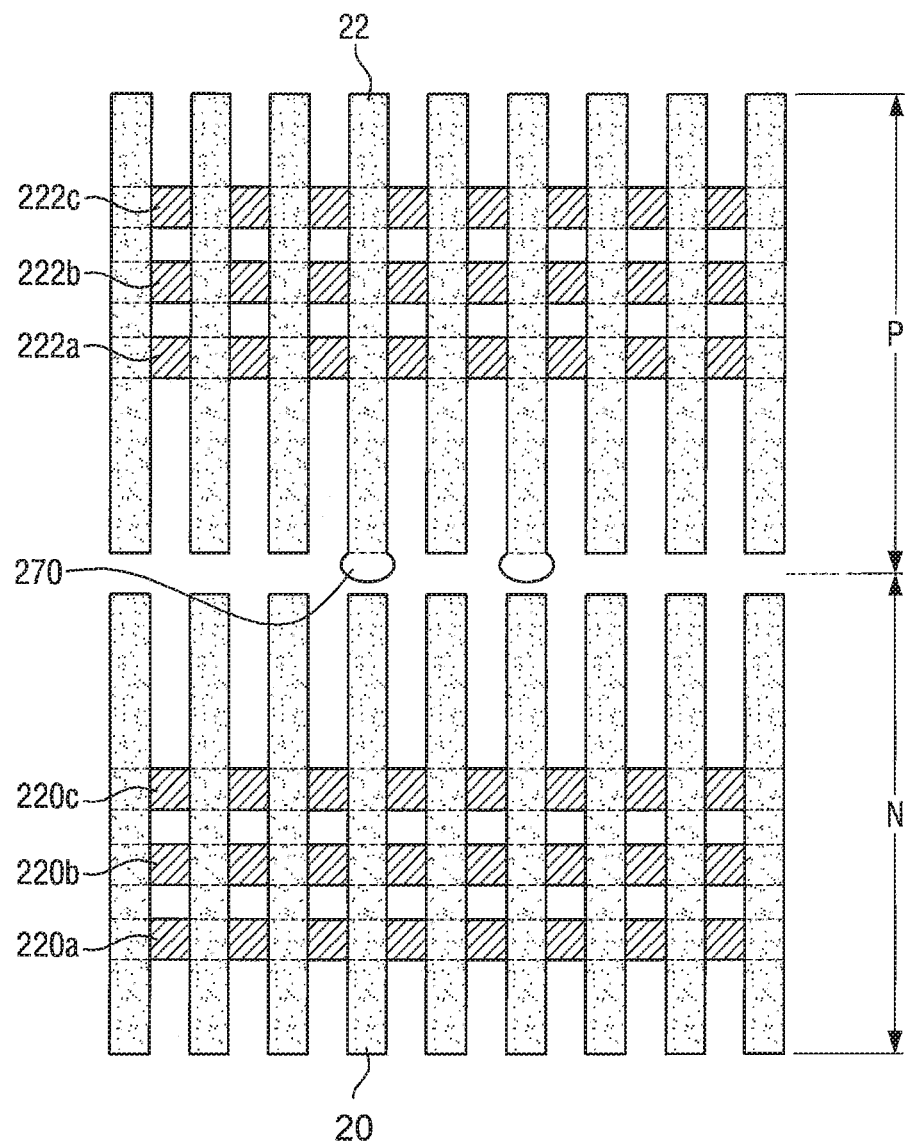
FIG. 10 is a top view of the semiconductor device having the nodule defects.

Likewise, if the area in which the first gate structure 20 is formed is an NMOS area, the NMOS area may include a first NMOS gate structure and a second NMOS gate structure located adjacent to each other in the second direction. The fabrication method may further include forming a dummy structure in a space between the first NMOS gate structure and the second NMOS gate structure if a distance between the first NMOS gate structure and the second NMOS gate structure is equal to or greater than a preset threshold value. In some embodiments of the present inventive concepts, the forming of the dummy structure in the space between the first NMOS gate structure and the second NMOS gate structure may include forming the dummy structure if the distance between the first NMOS gate structure and the second NMOS gate structure is 30 nm or more FIG. 9 is a cross-sectional view of a semiconductor device having nodule defects. FIG. 10 is a top view of the semiconductor device having the nodule defects.

In FIG. 9, a block layer 264 is formed only on a second gate structure 22. Specifically, if a spacer layer 250 of a first gate structure 20 is partially lost, a hard mask 240 and a polysilicon layer 230 inside the spacer layer 250 may be exposed, or the spacer layer 250 may have a thickness equal to or smaller than a threshold value. Therefore, in an area where the polysilicon layer 230 is exposed or the spacer layer 250 has a thickness equal to or smaller than the threshold value, a nodule defect 270 may be created. Without wishing to be bound by any theory of operation, the nodule defect 270 may be grown by the reaction of the polysilicon layer 230 with a growth gas used in a growth process. This nodule defect 270 may occur when ions scattered during an etching process collide with the first gate structure 20 and thus damage the spacer layer 250.

Therefore, according to various embodiments of the present inventive concepts, the block layer 264 formed on the second gate structure 22 may be extended to partially cover the first gate structure 20. This can reduce or prevent the spacer layer 250 at an edge of the first gate structure 20 from being damaged by a mountain effect or a 3D effect in an etching process performed to fabricate a semiconductor device. According to some embodiments of the present inventive concepts, the block layer 264 formed on the second gate structure 22 may be extended to partially cover the first gate structure 20 in a layout process performed to fabricate a semiconductor device.

Figure 11:
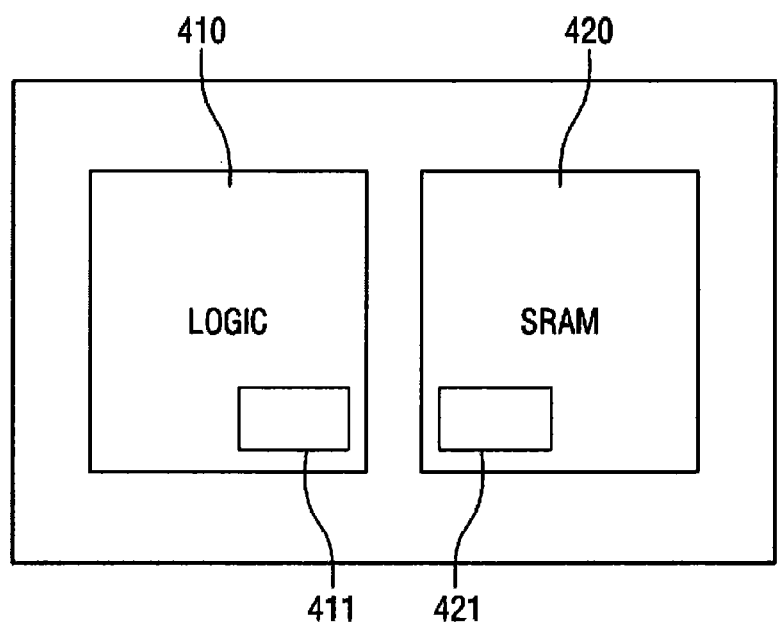
FIG. 11 is a diagram of a semiconductor device according to another embodiment of the present inventive concepts.
Figure 12:
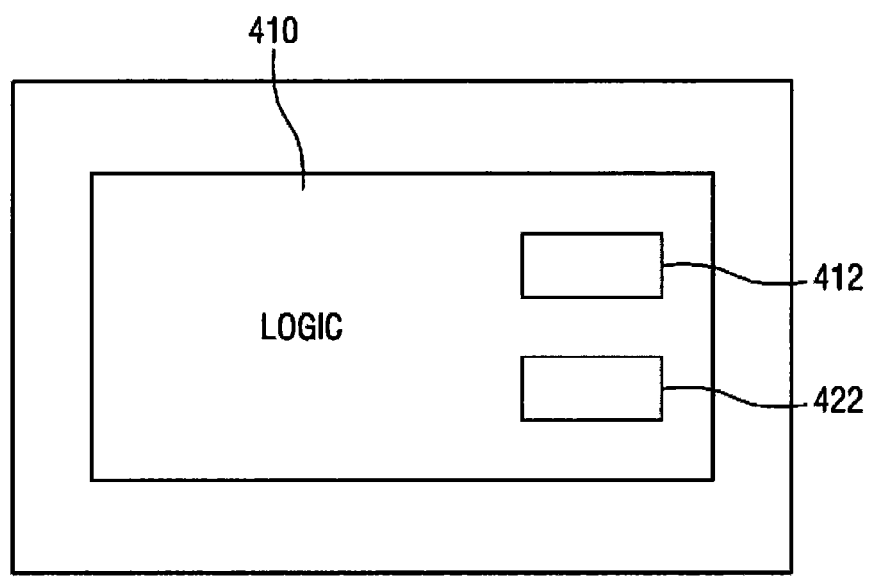
FIG. 12 is a diagram of a semiconductor device according to another embodiment of the present inventive concepts.

FIG. 11 is a diagram of a semiconductor device according to another embodiment of the present inventive concepts. FIG. 12 is a diagram of a semiconductor device according to another embodiment of the present inventive concepts.

Referring to FIG. 11, the semiconductor device according to the current embodiment may include a logic region 410 and a static random access memory (SRAM) region 420. A first transistor 411 may be disposed in the logic region 410, and a second transistor 421 may be disposed in the SRAM region 420.

In some embodiments of the present inventive concepts, the first transistor 411 and the second transistor 421 may be different from each other. For example, the first transistor 411 may be formed to include a dummy structure 160, and the second transistor 421 may be formed using an extended block layer 262. However, the present inventive concepts are not limited to this example.

In FIG. 11, the logic region 410 and the SRAM region 420 are illustrated as an example, but the present inventive concepts are not limited to this example. The present inventive concepts are also applicable to the logic region 410 and a region where another memory (e.g., DRAM, MRAM, RRAM, PRAM, etc.) is formed Referring to FIG. 12, the semiconductor device may include a logic region 410. In the logic region 410, third and fourth transistors 412 and 422 which are different from each other may be disposed. Although not specifically illustrated, the third and fourth transistors 412 and 422 which are different from each other may also be disposed in an SRAM region.

In some embodiments of the present inventive concepts, the third transistor 412 and the fourth transistor 422 may be different from each other. For example, the third transistor 412 may be formed to include a dummy structure 160, and the fourth transistor 422 may be formed using an extended block layer 262. However, the present inventive concepts are not limited to this example.

Figure 13:
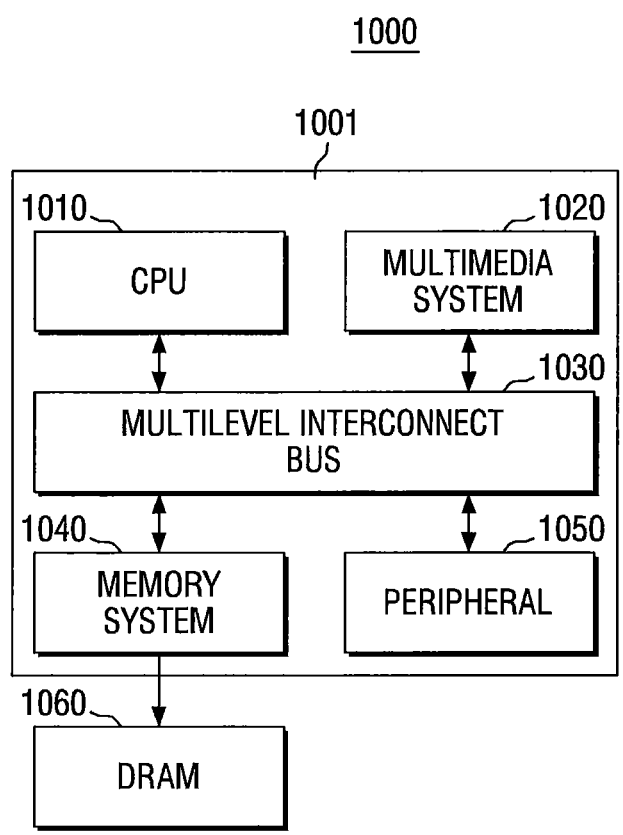
FIG. 13 is a block diagram of a system-on-chip (SoC) system including semiconductor devices according to embodiments of the present inventive concepts.

FIG. 13 is a block diagram of a system-on-chip (SoC) system 1000 including semiconductor devices according to embodiments of the present inventive concepts.

Referring to FIG. 13, the SoC system 1000 includes an application processor 1001 and a dynamic random access memory (DRAM) 1060.

The application processor 1001 may include a central processing unit (CPU) 1010, a multimedia system 1020, a bus 1030, a memory system 1040, and a peripheral circuit 1050.

The CPU 1010 may perform operations to drive the SoC system 1000. In some embodiments of the present inventive concepts, the CPU 1010 may be configured as a multi-core environment including a plurality of cores.

The multimedia system 1020 may be used to perform various multimedia functions in the SoC system 1000. The multimedia system 1020 may include a 3D engine module, a video codec, a display system, a camera system, a post-processor, etc.

The bus 1030 may be used for data communication among the CPU 1010, the multimedia system 1020, the memory system 1040 and the peripheral circuit 1050. In some embodiments of the present inventive concepts, the bus 1030 may have a multilayer structure. Specifically, the bus 1030 may be, but is not limited to, a multilayer advanced high-performance bus (AHB) or a multilayer advanced extensible interface (AXI).

The memory system 1040 may provide an environment for the application processor 1001 to be connected to an external memory (e.g., the DRAM 1060) and operate at high speed. In some embodiments, the memory system 1040 may include a controller (e.g., a DRAM controller) for controlling the external memory (e.g., the DRAM 1060).

The peripheral circuit 1050 may provide an environment for the SoC system 1000 to connect to an external device (e.g., mainboard). Accordingly, the peripheral circuit 1050 may include various interfaces that enable the external device connected to the SoC system 1000 to be compatible with the SoC system 1000.

The DRAM 1060 may function as an operating memory for the operation of the application processor 1001. In some embodiments, the DRAM 1060 may be placed outside the application processor 1001 as illustrated in the drawing. Specifically, the DRAM 1060 may be packaged with the application processor 1001 in the form of package on package (PoP).

At least one of the elements of the SoC system 1000 may employ any one of the semiconductor devices according to the above-described embodiments of the present inventive concepts.

Figure 14:
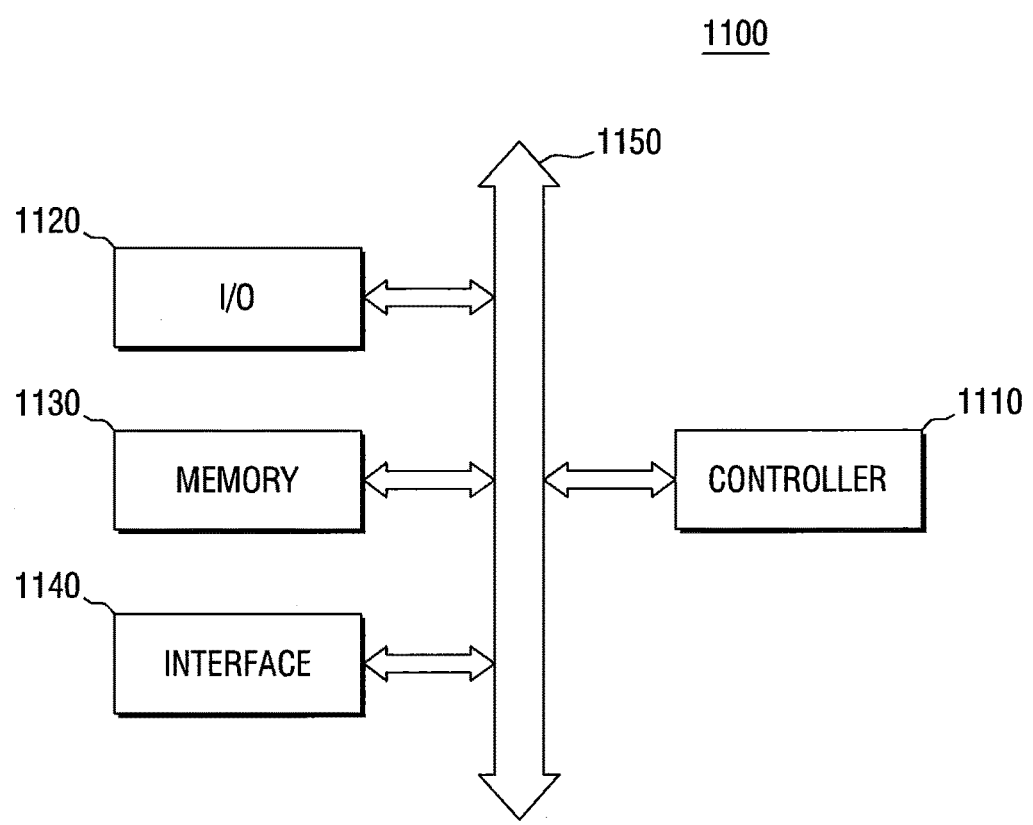
FIG. 14 is a block diagram of an electronic system including semiconductor devices according to embodiments of the present inventive concepts.

FIG. 14 is a block diagram of an electronic system 1100 including semiconductor devices according to embodiments of the present inventive concepts.

Referring to FIG. 14, the electronic system 1100 may include a controller 1110, an input/output (I/O) device 1120, a memory device 1130, an interface 1140 and a bus 1150. The controller 1110, the I/O device 1120, the memory device 1130 and/or the interface 1140 may be connected to one another by the bus 1150. The bus 1150 may serve as a path for transmitting data.

The controller 1110 may include at least one of a microprocessor, a digital signal processor, a microcontroller and logic devices capable of performing similar functions to those of a microprocessor, a digital signal processor and a microcontroller. The I/O device 1120 may include a keypad, a keyboard and a display device. The memory device 1130 may store data and/or commands. The interface 1140 may be used to transmit data to or receive data from a communication network. The interface 1140 may be a wired or wireless interface. In an example, the interface 1140 may include an antenna or a wired or wireless transceiver.

Although not illustrated in the drawing, the electronic system 1100 may be an operating memory for improving the operation of the controller 1110, and may also include a high-speed DRAM or SRAM. Here, any one of the semiconductor devices according to the above-described embodiments of the present inventive concepts may be employed as the operating memory. In addition, any one of the semiconductor devices according to the above-described embodiments may be provided in the memory device 1130, in the interface 1140, in the controller 1110 or in the I/O device 1120.

The electronic system 1100 may be applied to nearly all types of electronic products capable of transmitting or receiving information in a wireless environment, such as a personal data assistant (PDA), a portable computer, a web tablet, a wireless phone, a mobile phone, a digital music player, a memory card, etc.

Figure 15:
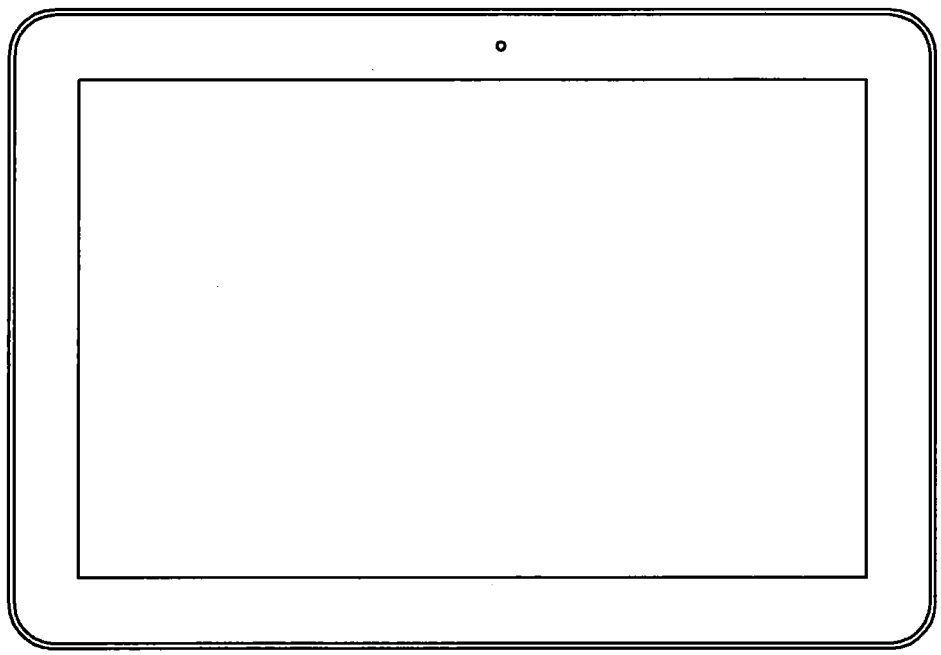
FIGS. 15 through 17 are diagrams illustrating examples of a semiconductor system to which semiconductor devices according to embodiments of the present inventive concepts can be applied.
Figure 16:
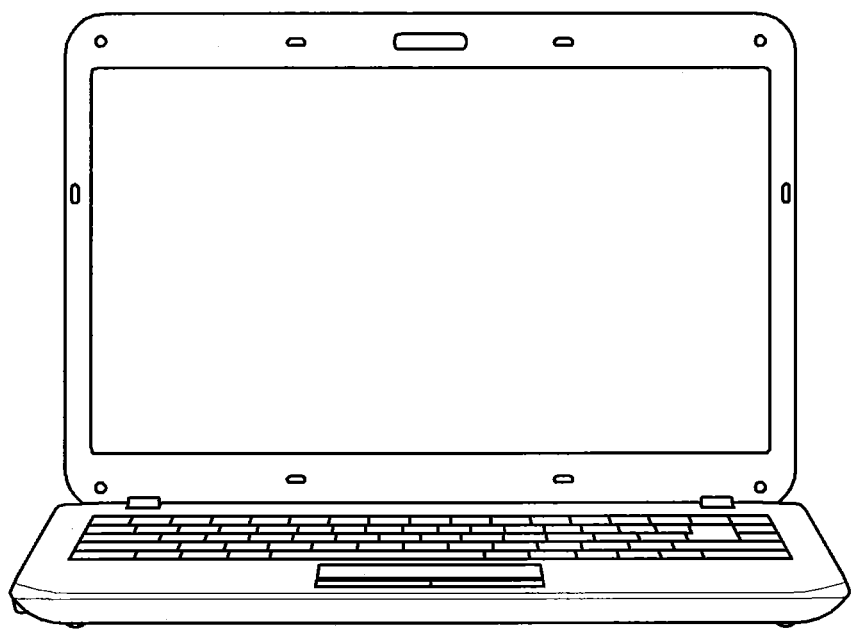
Figure 17:
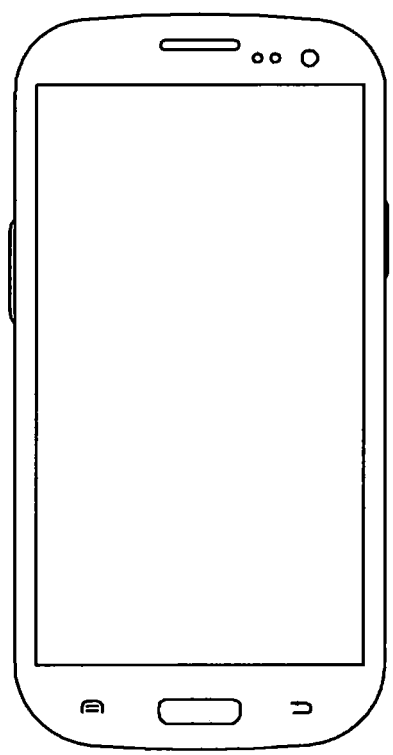

FIGS. 15 through 17 are diagrams illustrating examples of a semiconductor system to which semiconductor devices according to embodiments of the present inventive concepts can be applied.

FIG. 15 illustrates a tablet personal computer (PC) 1200, FIG. 16 illustrates a notebook computer 1300, and FIG. 17 illustrates a smartphone 1400. At least one of the semiconductor devices according to the above-described embodiments of the present inventive concepts, as set forth herein, may be used in the tablet PC 1200, the notebook computer 1300, and the smartphone 1400.

The semiconductor devices according to the embodiments of the present inventive concepts, as set forth herein, may also be applied to various IC devices other than those set forth herein. That is, while the tablet PC 1200, the notebook computer 1300, and the smartphone 1400 have been described above as examples of a semiconductor system according to an embodiment of the present inventive concepts, the examples of the semiconductor system according to the embodiment are not limited to the tablet PC 1200, the notebook computer 1300, and the smartphone 1400. In some embodiments of the present inventive concepts, the semiconductor system may be provided as a computer, an Ultra Mobile PC (UMPC), a work station, a net-book computer, a PDA, a portable computer, a wireless phone, a mobile phone, an e-book, a portable multimedia player (PMP), a portable game console, a navigation device, a black box, a digital camera, a 3-dimensional television set, a digital audio recorder, a digital audio player, a digital picture recorder, a digital picture player, a digital video recorder, a digital video player, etc.

While the present inventive concepts have been particularly shown and described with reference to various embodiments thereof, it will be understood by those of ordinary skill in the art that various changes in form and details may be made therein without departing from the spirit and scope of the present inventive concepts as defined by the following claims. It is therefore desired that the present embodiments be considered in all respects as illustrative and not restrictive, reference being made to the appended claims rather than the foregoing description to indicate the scope of the inventive concepts.

What is claimed is:

1. A method of fabricating a semiconductor device, the method comprising:
   forming a first active fin and a second active fin on a substrate to extend along a first direction;
   forming a first gate structure on the first active fin to extend along a second direction intersecting the first direction and a second gate structure on the second active fin to extend along the second direction; and
   forming a block layer on the second gate structure,
   wherein the block layer is extended to partially cover the first gate structure.

2. The method of claim 1, wherein the forming of the block layer on the second gate structure comprises forming the block layer such that an end of the block layer is located on the first gate structure.

3. The method of claim 2, wherein the first gate structure comprises a polysilicon layer and a spacer layer on the polysilicon layer, wherein the spacer layer comprises a sidewall spacer layer on a side surface of the polysilicon layer, and the forming of the block layer on the second gate structure comprises forming the block layer such that an end of the block layer is located between the sidewall spacer layer and the first active fin.

4. The method of claim 1, further comprising etching a portion of the first gate structure which is not covered by the block layer.

5. The method of claim 1, wherein an area in which the first gate structure is formed comprises a p-type metal oxide semiconductor (PMOS) area, and an area in which the second gate structure is formed comprises an n-type metal oxide semiconductor (NMOS) area.

6. The method of claim 5, wherein the PMOS area comprises a first PMOS gate structure and a second PMOS gate structure which are adjacent to each other in the second direction and further comprising forming a dummy structure in a space between the first PMOS gate structure and the second PMOS gate structure and separated by a first distance.

7. The method of claim 6, wherein the first distance is 30 nm or more.

8. The method of claim 1, wherein an area in which the first gate structure is formed comprises an NMOS area, and an area in which the second gate structure is formed comprises a PMOS area.

9. The method of claim 8, wherein the NMOS area comprises a first NMOS gate structure and a second NMOS gate structure which are adjacent to each other in the second direction and further comprising forming a dummy structure in a space between the first NMOS gate structure and the second NMOS gate structure and separated by a first distance.

10. The method of claim 9, wherein the first distance is 30 nm or more.

* * * * *